United States Patent
Quirmbach et al.

(10) Patent No.: US 6,445,227 B1
(45) Date of Patent: Sep. 3, 2002

(54) RATIONAL FREQUENCY DIVIDER

(75) Inventors: Gerhard Quirmbach; Dirk Schnabel, both of Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/762,451
(22) PCT Filed: Aug. 2, 1999
(86) PCT No.: PCT/DE99/02409

§ 371 (c)(1),
(2), (4) Date: Apr. 13, 2001

(87) PCT Pub. No.: WO00/08761
PCT Pub. Date: Feb. 17, 2000

(30) Foreign Application Priority Data

Aug. 6, 1998 (DE) .......................................... 198 35 640

(51) Int. Cl.[7] ................................................ H03B 19/00
(52) U.S. Cl. ........................................ 327/115; 327/117
(58) Field of Search ................................. 327/113, 115, 327/117, 118, 160; 377/83, 118, 121

(56) References Cited

U.S. PATENT DOCUMENTS

| | | | | |
|---|---|---|---|---|
| 3,824,378 A | | 7/1974 | Johnson et al. ................ 235/92 |
| 4,084,082 A | | 4/1978 | Alfke .......................... 235/92 |
| 4,296,407 A | | 10/1981 | Minakuchi ................... 340/347 |
| 5,459,435 A | * | 10/1995 | Taki ........................... 327/160 |
| 5,684,418 A | * | 11/1997 | Yanagiuchi .................. 327/117 |
| 5,714,896 A | | 2/1998 | Nakagawa et al. .......... 327/115 |
| 6,081,303 A | * | 6/2000 | Kim ............................ 327/115 |
| 6,255,882 B1 | * | 3/2001 | Hirai ........................... 327/115 |

FOREIGN PATENT DOCUMENTS

| | | |
|---|---|---|
| DE | 196 20 865 A1 | 11/1996 |
| EP | 0 351 212 | 1/1990 |
| JP | 57-15536 | 1/1982 |
| JP | 4-266221 | 9/1992 |

OTHER PUBLICATIONS

Patent Abstracts of Japan—57015536—Jan. 26, 1982.
Patent Abstracts of Japan—57138221—Aug. 26, 1982.

* cited by examiner

Primary Examiner—Kenneth B. Wells
Assistant Examiner—Linh Nguyen
(74) Attorney, Agent, or Firm—Bell, Boyd & Lloyd LLC

(57) ABSTRACT

A rational frequency divider for generating an integer frequency from a rational frequency, wherein the rational frequency divider contains a memory for storing first and second divider constants, a selection device for selecting one of the stored divider constants, a first counter which counts in synchronism with the oscillations of the rational frequency, a comparison device which compares the value of the first counter with the selected divider constant, a second counter which is coupled to the selection device and the comparison device and counts a number of predetermined time intervals; and a pulse generating device for corming the integer frequency by generating a pulse in response to a signal of the comparison device.

5 Claims, 2 Drawing Sheets

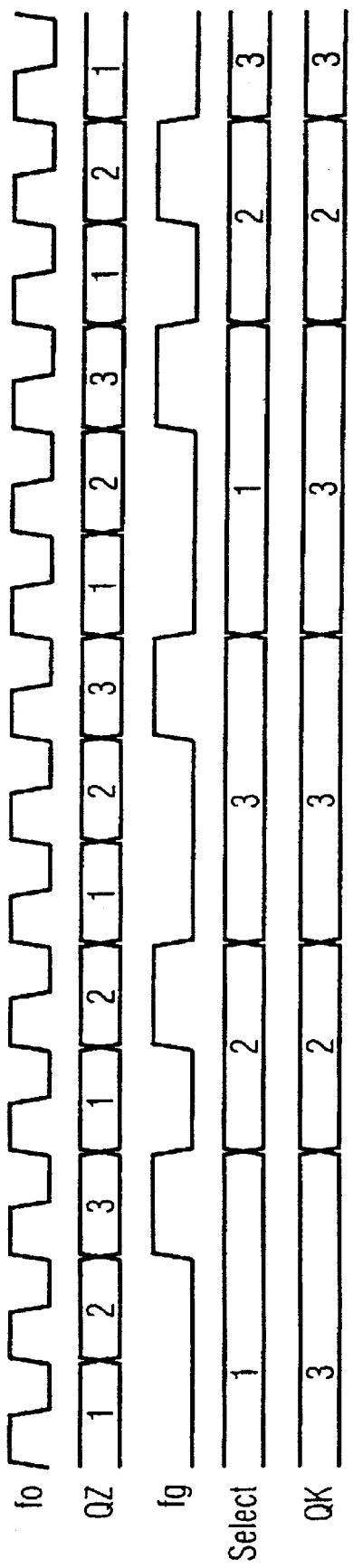

RATIONAL FREQUENCY DIVIDER

BACKGROUND OF THE INVENTION

The present invention generally relates to a rational frequency divider for generating an integer frequency from a rational frequency.

Processors such as the Pentium and Pentium II from Intel or the K6 from AMD which are frequently used, need a rational frequency (for example, 200/3 MHz=66.6̄ MHz) for operating the system buses (memories, PCI). Selecting such a frequency results in integral memory cycle times (15 ns at 66.6̄ MHz). Deviating, for example, from the rational frequency 66.6̄ MHz to the integer frequency 66.0 or 67.0 MHz is not permissible here since the operation of the processors cannot be guaranteed in such cases.

Other functions such as, for example, the operation of a real-time clock or the calculation of fee data in switching systems, however, require integral frequencies. To achieve an integer frequency, a crystal generator is normally used which generates oscillations of an integer frequency. The disadvantage, however, is that an asynchronous interface is created which is hard to operate.

Furthermore, it is known to divide the rational processor frequency by an integer, more precisely by a natural number (e.g., by 66 or 67) to achieve an integer frequency. The disadvantage of this, however is, that a large tolerance is created to which the real-time clock must be frequently corrected and an additional correction is required for each call charge registration.

From patent U.S. Pat. No. 5,714,896, a frequency divider for generating an integer frequency from a rational frequency is known. The frequency divider contains a memory for storing a first divider constant and a second divider constant. A selection device is used for selecting one of the two divider constants. A first counter is contained in a programmable frequency divider which divides in synchronism with the oscillation of the rational frequency. In addition, the frequency divider contains a counter which is coupled to the selection device and which counts a number of predetermined time intervals in which one of the two divider constants is used. A further counter also is coupled to the selection device and is used for counting the time intervals in which the other divider constant is used. Thus, three counters are used so that the circuit complexity is comparatively high. In addition, a control unit must switch between the counters for the time intervals.

From the article by P. Larsson, "A wide-Range Programmable High-Speed CMOS Frequency Divider", IEEE Int. Symposium on Circuits and Systems, US, New York, 1995, a frequency divider for generating an integer frequency from a rational frequency is known. The frequency divider contains three counters, one of which is programmable and counts in synchronism with the oscillations of the rational frequency. The programmable divider divides as a function of a divider constant stored in a register. The programmable divider also contains a comparison device and is driven by a control unit which selects one of two divider constants.

From patent application JP 57 138221 A, a switchable frequency divider is known which divides in accordance with a divider constant or in accordance with half the value of the divider constant. The frequency divider contains a counter and a comparison device.

It is, therefore, an object of the present invention to create a rational frequency divider in which the disadvantages described above do not occur, and to provide a corresponding method.

SUMMARY OF THE INVENTION

Accordingly, a rational frequency divider for generating an integer frequency from a rational frequency is provided by the present invention which includes: a memory for storing first and second divider constants; a selection device for selecting one of the stored divider constants; a first counter which counts in synchronism with the oscillations at the rational frequency; a comparison device which compares the value of the first counter with the selected divider constant; a second counter which is coupled to the selection device and the comparison device and counts a number of predetermined time intervals; and a pulse generating device for forming the integer frequency by generating a pulse in response to a signal from the comparison device. The device of the present invention provides with little circuit expenditure a rational frequency divider which is suitable for generating an integer frequency from a rational frequency.

According to a preferred embodiment of the present invention, the rational frequency divider is constructed in such a manner that it is suitable for generating an integer frequency from a rational frequency in accordance with the relation $$f_g = \frac{f_0}{g^{\frac{z}{n}}}$$

where $f_g$ is the integer frequency, $f_0$ is the rational frequency, g is a first divider constant, z is a divider constant counter, n is the number of time intervals, and g, z and n are natural numbers. In particular, the memory has areas for storing n−z first and z second divider constants g and g+1, respectively. The selection device is constructed in such a manner that the stored divider constants are, in each case, selected once within one cycle of n time intervals during operation. The first counter is constructed in such a manner that it is reset to the value 1 in response to a signal of the comparison device which indicates the quality of the value of the first counter with the selected divider constant. The second counter is constructed in such a manner that it is incremented by the value 1 and, after reaching the value of n, is reset to 1 in response to a signal of the comparison device which indicates the equality of the value of the first counter with the selected divider constant.

Moreover, the present invention creates a method for generating an integer frequency from a rational frequency which includes the steps of:

a) determining and storing the quantities g, z and n in accordance with the relation $$f_g = \frac{f_0}{g^{\frac{z}{n}}},$$

where $f_g$ is the integer frequency, $f_0$ is the rational frequency, g is a first divider constant, z is a divider constant counter and n is the number of time intervals and g, z and n are natural numbers, and the quantity g+1 represents a second divider constant; b) initializing a first counter which counts in synchronism with the oscillations of the rational frequency, and a second counter which counts the time intervals, to the value 1; c) selecting the first or second divider constant; d) counting the first counter in synchronism with the oscillations of the rational frequency; e) detecting the equality of the value of the first counter and of the selected divider constant; f) generating a pulse on the detection of the equality of the value of the first counter and of the selected divider constant for forming the integer frequency; g) resetting the first counter to the value 1; g) incrementing the second counter by 1; I repeating steps c) to h), the first divider constant being selected (n–z) times, and the second divider constant being selected z times, during a cycle of n time intervals; and k) resetting the second counter to the value 1 after the second counter has reached the value of n and steps c) to g) have been performed n times. The oscillation generated in accordance with the method the present invention has the precise predetermined integer frequency in each case immediately after the nth time interval.

Additional features and advantages of the present invention are described in and will be apparent from, the following Detailed Description of the Invention and the Figures

BRIEF DESCRIPTION OF THE FIGURES

FIG. 4 shows a timing diagram of the rational divider of the present invention shown in FIG. 3.

DETAILED DESCRIPTION OF THE INVENTION

The frequency division is described both with respect to the general case in which an arbitrary rational frequency is divided into an arbitrary integer frequency by a suitable choice of a rational number r, and for the special case in which a rational frequency of $f_0$=200/3 MHz is divided by the rational number r=$g^{z/n}$=$2^{2/3}$ into the integer frequency $f_g$=$f_0$/r=25 MHz.

Figure 1:
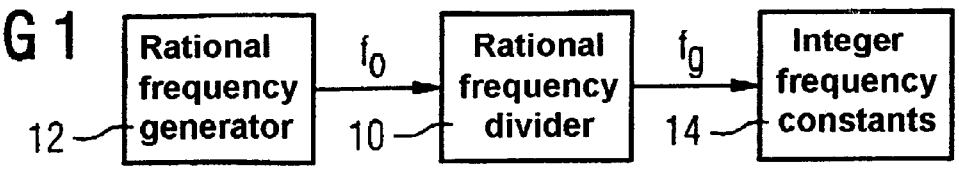
FIG. 1 shows a diagram which represents the generation of an integer frequency from a rational frequency by using the rational frequency divider of the present invention and an integral divider in accordance with the prior art.

According to FIG. 1, a rational frequency generator 12 generates an oscillation with the rational frequency $f_0$ of, for example, 200/3 MHz, which frequency is divided, by a rational frequency divider 10, by a rational number r=$2^{2/3}$ to produce an oscillation at the integer frequency $$f_g = \frac{200/3}{2^{\frac{2}{3}}} \text{ MHz} = 25 \text{ MHz}.$$

the integer frequency $f_g$=25 MHz then can be divided further by an integer or, more precisely, by a natural number, via a conventional integer frequency divider 14. This results, for example, in an accurate time base of 1 µs in the case of a division by 25.

The rational frequency divider 10 is determined by the fact that division by a divider constant does not take place over the entire period but over n time intervals by, in each case, one of two divider constants g or, respectively, g+1. Division by g takes place (n–z) times whereas division by g+1 takes place z-times.

Thus, the rational number r can be replaced as follows:

$$r = g^{\frac{z}{n}} = \frac{n-z}{n} \cdot g + \frac{z}{n}(g+1),$$

i.e., in the case of g=2, z=2 and n=3, $$r = g^{\frac{z}{n}} = \frac{3-2}{3} \cdot 2 + \frac{2}{3} \cdot (2+1) = 2^{\frac{2}{3}}$$

is obtained.

In addition, another determination of the divider constants and of the quantities z and n for achieving the same result is possible; i.e., the determination of the divider constants and the quantities z and n is arbitrary.

Figure 2:
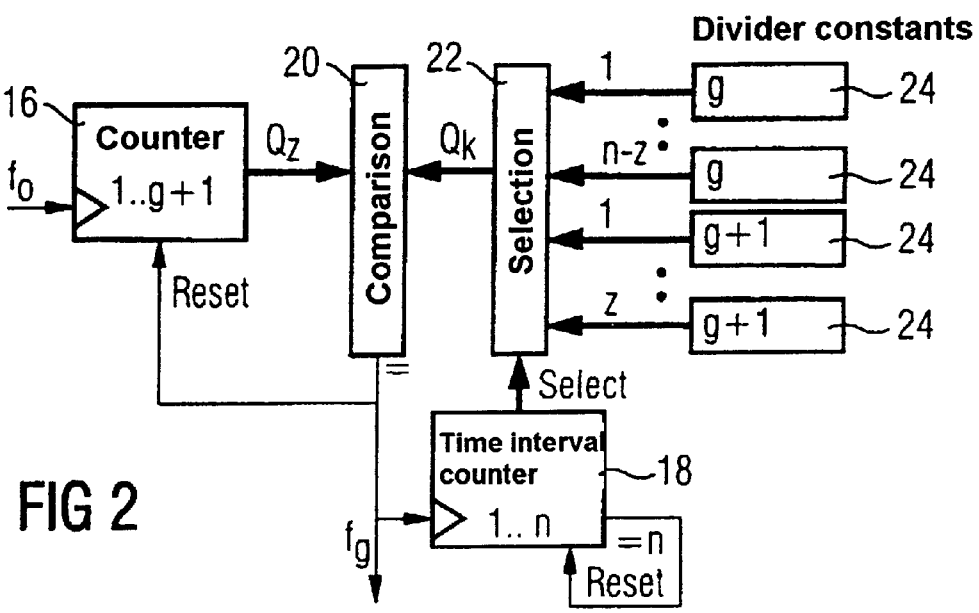
FIG. 2 shows a block diagram of the rational divider-of the present invention, which is suitable for dividing frequency in accordance with the relation $$f_g = \frac{f_0}{g^{\frac{z}{n}}}.$$

FIG. 2 shows a general implementation of the rational frequency divider. Correspondingly, reference numeral 16 designates a first counter which is connected at its input to the rational frequency generator 12 and at its output to a comparison device 20. The first counter 16 counts a number QZ in synchronism with the oscillation at the frequency $f_0$. A memory 24 consisting of n memory parts for storing n–z first and z second divider constants g and g+1, respectively, is connected to a first input of a selection device 22. A second input of the selection device 22 is connected to a second counter (time interval counter which counts n times intervals in one cycle) 18 and an output of which is connected to the comparison device 20. A pulse generating device, not shown, for generating an oscillation with the integer frequency $f_g$ is coupled to the comparison device 20.

Figure 3:
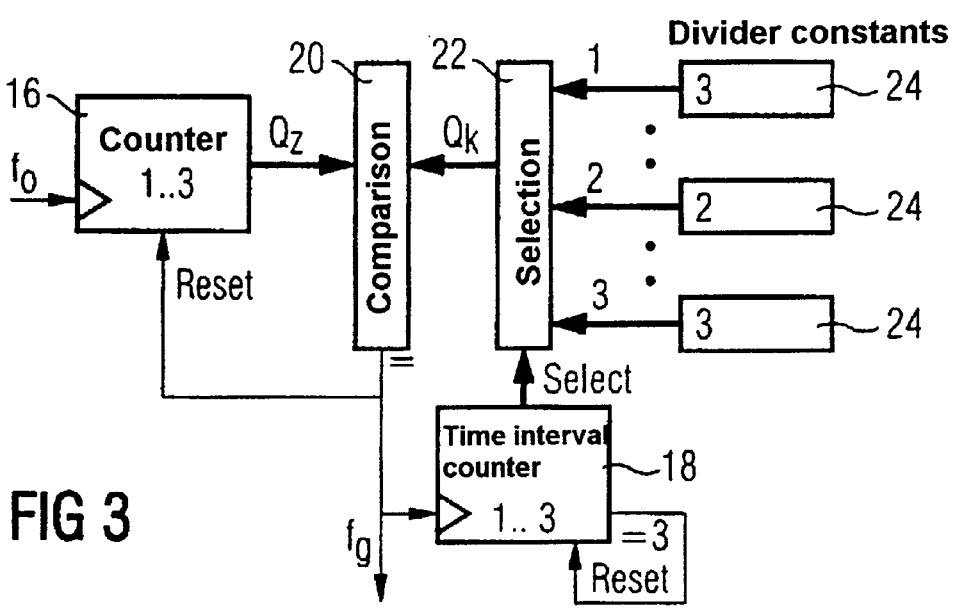
FIG. 3 shows a block diagram of the rational divider of the present invention of FIG. 2 for the special case g=2, z=2 and n=3.

FIG. 3 represents a special case of the rational frequency divider of FIG. 2 which is provided for frequency division by the rational number r=$2^{2/3}$ (g=2, z=2, n=3). In this embodiment, the memory contains three memory parts (equal to the value of n), the content of which is 3 (g=1 for the first time), 2 (g) and, respectively, 3 (g+1 for the second time).

In the text which follows, the operation of the rational frequency divider according to the embodiment shown in FIG. 3 is represented with reference to the timing diagram shown in FIG. 4. In this arrangement, a frequency division is carried out in accordance with the relation $$f_g = \frac{f_0}{g^{\frac{z}{n}}},$$

to the extent that, in order to achieve the integer frequency, the rational frequency $f_0$ is divided by the rational number r=$2^{2/3}$ (g=2, z=2, n=3).

The first counter 16 counts in synchronism with the rational frequency supplied to it, from 1 to a maximum of g or, respectively, g+1 and supplies this value as quantity QZ to the comparison device 20. When the final value g or, respectively, g+1 (in accordance with a selected divider constant described below) is reached, this is detected by the comparison device 20 which thereupon resets the counter 16 to its initial value by applying a reset signal in the next cycle. Furthermore, the comparison device 20, when the final value of the first counter 16 is reached, causes the time interval counter 18 to continue counting and causes the pulse generating device, not shown, to generate a pulse which defines the integer frequency $f_g$.

The time interval counter 18 counts from 1 to n within one cycle, wherein n is the number of predetermined time intervals needed for generating just one integer frequency. In each of the n time intervals, the time interval counter selects via the selection device 22 a divider constant g or g+1, stored in the part memories of the memory 24, which constant is passed on by the selection device to the comparison device as quantity QK. During one cycle, or during n=3 time intervals, the first divider constant g is selected once (n−z=3−2=1) and the second divider constant g+1 is selected twice (z=2). Here, one after the other, the divider constants g+1=3 (select=1), g=2 (select=2) and g+1=3 (select=3) are selected and applied to the comparison device 20. Advantageously, selection begins with the divider constant which is closest to the rational number r in order to minimize the deviation of the instantaneous integer frequency $f_g$ within one unfinished cycle from the exact integer frequency at the end of each cycle. At the end of each time interval, the instantaneous integer frequency $f_g$ has come closer to the exact integer frequency at the end of each cycle. After the nth working cycle has been performed, the time interval counter is reset to the value 1 and the next cycle is begun.

Although the present invention has been described with reference to specific embodiments, those of skill in the art will recognize that changes may be made thereto without departing from the spirit and scope of the invention as set forth in the hereafter appended claims.

What is claimed is:

1. A rational frequency divider for generating an integer frequency from a rational frequency, comprising:

a memory for storing first and second divider constants;

a selection device for selecting one of the stored divider constants;

a first counter which counts in synchronism with oscillations of the rational frequency;

a second counter which is coupled to the selection device and which counts a number of predetermined time intervals;

a comparison device which compares a value of the first counter with the selected one of the stored divider constants, the second counter being coupled to the comparison device, and the memory storing at least three first and second divider constants; and a pulse generating device for forming the integer frequency by generating a pulse in response to a signal of the comparison device.

2. A rational frequency divider for generating an integer frequency from a rational frequency as claimed in claim 1, wherein the second counter counts from 1 to n within one cycle, with n being a number of predetermined time intervals which is needed for generating an integer frequency, and wherein the divider constants are stored in the memory such that a change between the first and the second divider constants occurs at least twice during one cycle.

3. A rational frequency divider for generating an integer frequency from a rational frequency as claimed in claim 2, wherein a cycle is begun within integral divider constant which is closest to the rational number of the dividing ratio.

4. A rational frequency divider for generating an integer frequency from a rational frequency as claimed in claim 1, further comprising:

means for generating an integer frequency from a rational frequency according to the relation $$f_g = \frac{f_0}{g^{\frac{z}{n}}}$$

where $f_g$ is the integer frequency, $f_0$ is the rational frequency, g is a first divider constant, z is a divider constant counter, n is the number of time intervals, and g, z and n are natural numbers;

wherein the memory has areas for storing n−z first and z second divider constants g and g+1, respectively;

wherein the selection device is constructed such that the stored divider constants are respectively selected once within one cycle of n time intervals during operation;

wherein the first counter is constructed such that it is reset to the value 1 in response to a signal of the comparison device which indicates equality of the value of the first counter with the selected divider constant; and wherein the second counter is constructed such that it is incremented by the value 1 and, after reaching the value of n, is reset to 1 in response to a signal of the comparison device which indicates the equality of the value of the first counter with the selected divider constant.

5. A method for generating an integer frequency from a rational frequency, the method comprising the steps of:

a) determining and storing quantities g, z and n in accordance with the relation $$f_g = \frac{f_0}{g^{\frac{z}{n}}}$$

where $f_g$ is the integer frequency, $f_0$ is the rational frequency, g is a first divider constant, z is a divider constant counter, n is the number of time intervals, g, z and n are natural numbers, and the quantity g+1 represents a second divider constant;

b) initializing both a first counter, which counts in synchronism with oscillations of the rational frequency, and a second counter, which counts the time intervals, to the value 1;

c) selecting one of the first and the second divider constants;

d) counting the first counter in synchronism with the oscillations of the rational frequency;

e) detecting equality of the value of the first counter and of the selected divider constant;

f) generating a pulse upon detection of the equality of the value of the first counter and of the selected divider constant for forming the integer frequency;

g) resetting the first counter to the value 1;

h) incrementing the second counter by 1;

i) repeating steps c) through h), the first divider constant being selected (n−z) times and the second divider constant being selected z times during a cycle of n time intervals; and k) resetting the second counter to the value 1 after the second counter has reached the value of n and steps c) through g) have been performed n times.

* * * * *